(12) United States Patent
Root et al.

(10) Patent No.: US 9,678,149 B2
(45) Date of Patent: Jun. 13, 2017

(54) TEST APPARATUS HAVING A PROBE CORE WITH A TWIST LOCK MECHANISM

(71) Applicant: CELADON SYSTEMS, INC., Apple Valley, MN (US)

(72) Inventors: Bryan J. Root, Apple Valley, MN (US); William A. Funk, Eagan, MN (US)

(73) Assignee: Celadon Systems, Inc., Burnsville, MN (US)

( * ) Notice: Subject to any disclaimer, the term of this patent is extended or adjusted under 35 U.S.C. 154(b) by 199 days.

(21) Appl. No.: 14/166,296

(22) Filed: Jan. 28, 2014

(65) Prior Publication Data

US 2014/0139248 A1 May 22, 2014

Related U.S. Application Data

(63) Continuation of application No. 13/010,234, filed on Jan. 20, 2011, now Pat. No. 8,674,715.

(60) Provisional application No. 61/296,773, filed on Jan. 20, 2010.

(51) Int. Cl.
| | | |
|---|---|---|
| *G01R 31/28* | (2006.01) | |
| *G01R 1/073* | (2006.01) | |
| *G01R 3/00* | (2006.01) | |
| *H05K 1/11* | (2006.01) | |
| *H05K 3/32* | (2006.01) | |

(52) U.S. Cl.
CPC ..... *G01R 31/2889* (2013.01); *G01R 1/07378* (2013.01); *G01R 3/00* (2013.01); *G01R 31/2886* (2013.01); *H05K 1/117* (2013.01); *H05K 3/325* (2013.01); *H05K 2201/09027* (2013.01); *H05K 2201/09063* (2013.01); *H05K 2201/09227* (2013.01); *H05K 2203/167* (2013.01); *Y10T 29/49126* (2015.01); *Y10T 29/49128* (2015.01)

(58) Field of Classification Search
CPC ... G01R 31/2889; G01R 1/07378; G01R 3/00
USPC ..................................................... 324/754.07
See application file for complete search history.

(56) References Cited

U.S. PATENT DOCUMENTS

| | | |
|---|---|---|
| 3,866,119 A | 2/1975 | Ardezzone et al. |
| 5,148,103 A | 9/1992 | Pasiecznik, Jr. |
| 5,532,608 A | 7/1996 | Behfar-Rad et al. |

(Continued)

FOREIGN PATENT DOCUMENTS

WO    2013/006770    1/2013

*Primary Examiner* — Thomas Valone
(74) *Attorney, Agent, or Firm* — Hamre, Schumann, Mueller & Larson, P.C.

(57) ABSTRACT

A probe core includes a frame, a wire guide connected to the frame, a probe tile, and a plurality of probe wires supported by the wire guide and probe tile. Each probe wire includes an end configured to probe a device, such as a semiconductor wafer. Each probe wire includes a signal transmitting portion and a guard portion. The probe core further includes a lock mechanism supported by the frame. The lock mechanism is configured to allow the probe core to be connected and disconnected to another test equipment or component, such as a circuit board. As one example, the probe core is configured to connect and disconnect from the test equipment or component in a rotatable lock and unlock operation or twist lock/unlock operation, where the frame is rotated relative to remainder of the core to lock/unlock the probe core.

15 Claims, 8 Drawing Sheets

(56) References Cited

U.S. PATENT DOCUMENTS

| | | | |
|---|---|---|---|
| 5,949,244 A | 9/1999 | Miley | |
| 5,969,535 A | 10/1999 | Saito | |
| 6,034,533 A | 3/2000 | Tervo et al. | |
| 6,201,402 B1 | 3/2001 | Root | |
| 6,586,954 B2 | 7/2003 | Root | |
| 6,963,207 B2 | 11/2005 | Root et al. | |
| 6,975,128 B1 | 12/2005 | Root et al. | |
| 6,992,495 B2 | 1/2006 | Root et al. | |
| 7,181,999 B1 * | 2/2007 | Skeels | H01R 43/26 81/124.2 |
| 7,683,645 B2 | 3/2010 | Ku et al. | |
| 8,674,715 B2 * | 3/2014 | Root | H05K 1/117 324/754.07 |
| 9,024,651 B2 * | 5/2015 | Root | G01R 31/2889 324/750.08 |
| 2004/0174175 A1 | 9/2004 | Root et al. | |
| 2006/0049841 A1 | 3/2006 | Root et al. | |
| 2007/0007977 A1 | 1/2007 | Eldridge et al. | |
| 2008/0258713 A1 | 10/2008 | Green et al. | |
| 2009/0009198 A1 | 1/2009 | Ku et al. | |
| 2011/0204912 A1 * | 8/2011 | Root | H05K 1/117 324/754.07 |
| 2014/0210501 A1 * | 7/2014 | Root | G01R 31/2889 324/750.19 |
| 2014/0225636 A1 * | 8/2014 | Root | G01R 31/2889 324/750.24 |

\* cited by examiner

TEST APPARATUS HAVING A PROBE CORE WITH A TWIST LOCK MECHANISM

This application claims the benefit of U.S. Provisional Application Ser. No. 61/296,773 filed on Jan. 20, 2010, and titled "Test Apparatus Having Probe Core with a Twist Lock Mechanism", the entirety of which is incorporated by reference herewith.

FIELD

This disclosure relates generally to test equipment, particularly for testing a semiconductor device. More particularly, the disclosure herein relates to a probe apparatus structured as probe core that is used with test equipment for electrically probing a semiconductor device, such as a semiconductor wafer.

BACKGROUND

The semiconductor industry continues to have a need to access many electronic devices on a semiconductor wafer. As the semiconductor industry grows and devices become more complex, many electrical devices, most commonly semiconductor devices, must be electrically tested, for example, for leakage currents and extremely low operating currents. These currents are often below 100 fA (Femto Ampere, e.g. $1\times10^{-15}$ Amp). In addition, the currents and device characteristics are often required to be evaluated over a wide temperature range to understand how temperature affects a device. Also, due to characteristics of dielectric materials, it is often difficult to test characteristics of semiconductor devices in a wide operating temperature range.

To effectively measure at currents below 100 fA, a measurement signal must be isolated from external electrical interference, leakage currents through the dielectric material, parasitic capacitance, triboelectric noise, piezoelectric noise, and dielectric absorption, etc.

Accordingly, there continues to be a need for improved semiconductor test equipment for electrically probing semiconductor devices, such as semiconductor wafers, at low currents over a wide temperature range. There is also a need to improve upon probe mounting equipment and circuit board layout designs, and their structures so as to optimize such diagnostic capabilities.

SUMMARY

Test equipment is described that is useful, for example, in systems to test a semiconductor device. More particularly, a probe apparatus is described that can be used to electrically probe a semiconductor device, such as a semiconductor wafer. Generally, the probe apparatus is a probe core that can be locked and unlocked with respect to another test equipment or component, such as a circuit board, and where the probe core has probe wires that can probe the device and transmit signals through the probe wires from the probe core, for example, to other testing equipment.

In one embodiment, a probe core comprises a frame, a wire guide connected to the frame, a probe tile connected to the wire guide, and a plurality of probe wires supported by the wire guide and probe tile. Each wire includes an end configured to probe a device, such as a semiconductor wafer. Each wire includes a signal transmitting portion and a guard portion. The probe core further includes a lock mechanism supported by the frame. The lock mechanism is configured to allow the probe core to be connected and disconnected to another test equipment or component. In one embodiment, the probe core is configured to connect and disconnect from the test equipment or component in a rotatable lock and unlock operation.

In one embodiment, a probe core such as described above can be incorporated as part of a test apparatus, where the probe core can be locked and unlocked with respect to another test equipment or component. In one embodiment, the another test equipment or component, for example, is a circuit board or motherboard. The test apparatus can be part of an overall system for testing devices, such as semiconductor devices.

In one embodiment, the circuit board has a pattern of signal contacts and a pattern of guard contacts. In one embodiment, the circuit board is configured as a plate having a top side, a bottom side, and an opening through the top and bottom sides. The probe core is insertable into the opening and configured to be connected and disconnected with the circuit board. Each wire of the plurality of probe wires has an end configured to probe the device to be tested. Each probe wire has a signal transmitting portion that matches a portion of a respective signal contact in the pattern of signal contacts, and each probe wire has a guard portion that matches a portion of a respective guard contact in the pattern of guard contacts.

In another embodiment, the lock mechanism comprises a ramped protrusion and handle portion. The ramped protrusion has a detent configured to allow the probe core to lock onto the circuit board. The handle portion is configured to allow the probe core to be rotatably locked and rotatably unlocked from the circuit board. In one embodiment, the lock mechanism features are disposed on the frame of the probe core.

In another embodiment, the wire guide comprises a groove structure to support each probe wire. The groove structure supports a portion of each of the signal transmission portion and the guard portion of the probe wires. In yet another embodiment, the wire guide comprises at least one hole viewable of at least one of the plurality of probe wires. The hole is configured to allow confirmation position of the respective probe wire.

In one embodiment, a method for assembling a probe card onto a circuit board comprises aligning a probe card with a circuit board. The probe card includes a plurality probe wires, where each wire has a signal transmitting portion and a guard portion. The circuit board includes a pattern of signal contacts and a pattern of guard contacts. By the aligning step, each probe wire has its signal transmitting portion respectively aligned and in contact with a portion of a respective signal contact of the pattern of signal contacts and each probe wire has its guard portion respectively aligned and in contact with a portion of a respective guard contact of the pattern of guard contacts. The method further includes inserting the probe card into the circuit board, and rotating the probe card with respect to the circuit board to thereby lock the probe card onto the circuit board. In one embodiment, the rotating step includes rotating a portion of the probe card, such as for example, an outer frame, relative to the circuit board, while the probe wires remain aligned or keyed with respect to the pattern of signal contacts and guard contacts on the circuit board.

DESCRIPTION OF THE DRAWINGS

The drawings, which are not necessarily drawn to scale, illustrate generally by way of example, but not by way of limitation, various embodiments discussed in this application.

DETAILED DESCRIPTION

FIGS. 1-8 and FIG. 10 show one embodiment of test equipment that can be used in a system to test devices, such as for example, semiconductor devices including but not limited to semiconductor wafers. Particularly, an apparatus is described that is configured as a probe test core and can be used to electrically probe a semiconductor device, such as a semiconductor wafer. Generally, the probe test core can be locked and unlocked with respect to another test equipment or component, such as a circuit board. The probe test core has probe wires that can probe the device to be tested and transmit signals through the probe test core and through a circuit board, for example, to other testing equipment.

Figure 1:
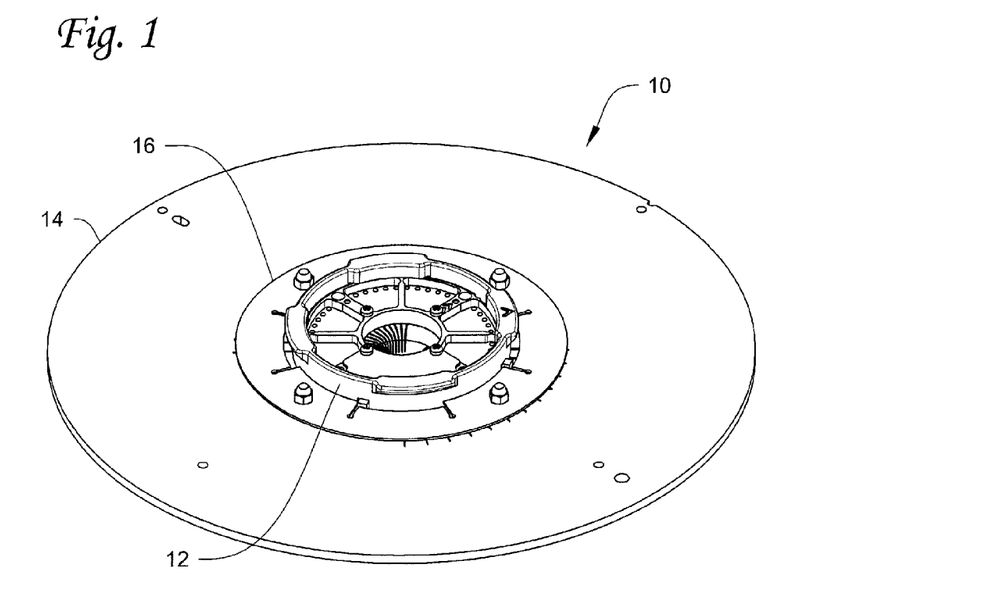
FIG. 1 is a top perspective view of one embodiment of a probe test core that shows the probe test core connected to a circuit board.

FIG. 1 is a top perspective view of one embodiment of a probe test core 12 as part of probe test equipment 10. As shown, the probe test core 12 is connected to a circuit board 14. The probe test core 12 is configured such that it may be locked and unlocked with respect to the circuit board 14, the locking mechanism and its structures of which will be further described below. As further shown, a guard plate 16 is disposed on the circuit board 14 so as to allow one to assemble the probe test equipment 10 without contacting (or contaminating) the circuit board 14. For example, the probe test core 12 can be connected to the circuit board 14 without contacting or contaminating the circuit board 14, since the guard plate 16 helps prevent such contact or unnecessary handling by a user or assembler (e.g. by hand contact).

Figure 2:
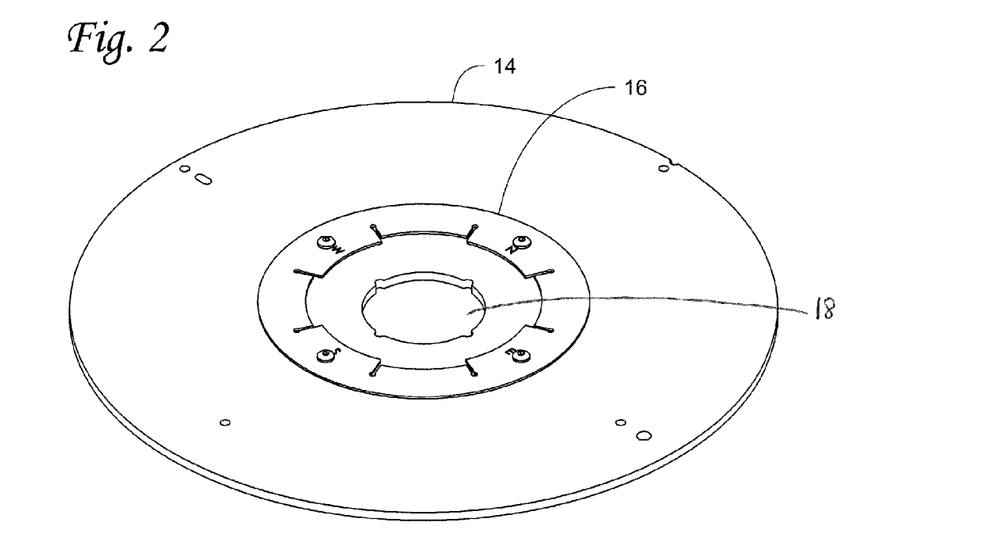
FIG. 2 is a top perspective view of the circuit board of FIG. 1 alone.

Referring further to the circuit board 14, FIG. 2 is a top perspective view of the circuit board 14 alone. In one embodiment, the circuit board 14 is configured as a plate having a top side, a bottom side, and an opening 18 through the top and bottom sides. In one embodiment, the circuit board 14 is a motherboard of contacts (see FIG. 3) that helps deliver signals from the probe test core 12 to additional test/measurement equipment used, for example in an overall electrical diagnostic system, such as for testing semiconductor devices. In the example shown, the plate is a circular shape, and the opening 18 is generally through the center of the circular plate. It will be appreciated that other shape configurations may be employed, as well as other placement for the opening.

Figure 3:
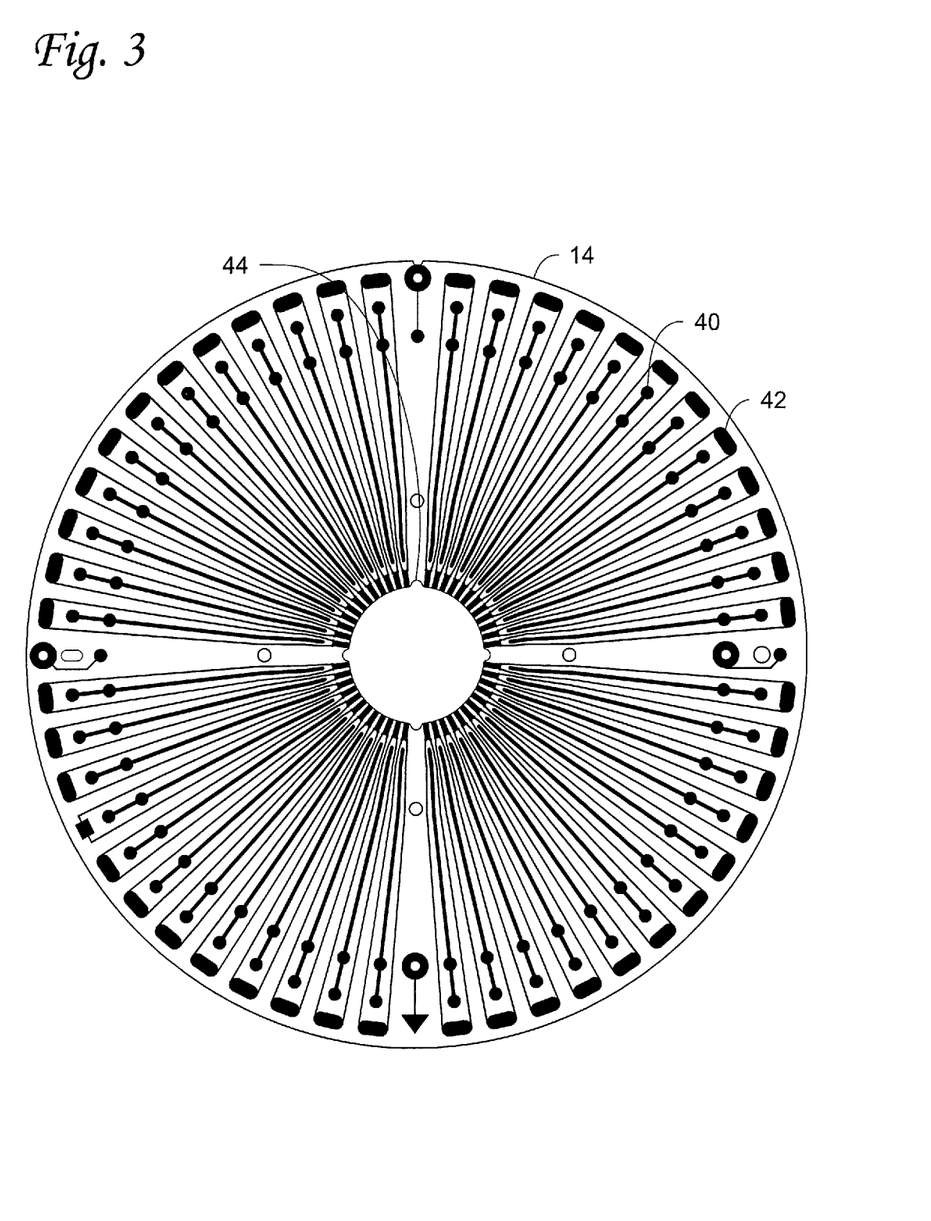
FIG. 3 is a top view of the circuit board of FIG. 1 alone showing one embodiment of a contact and guard layout.
Figure 4:
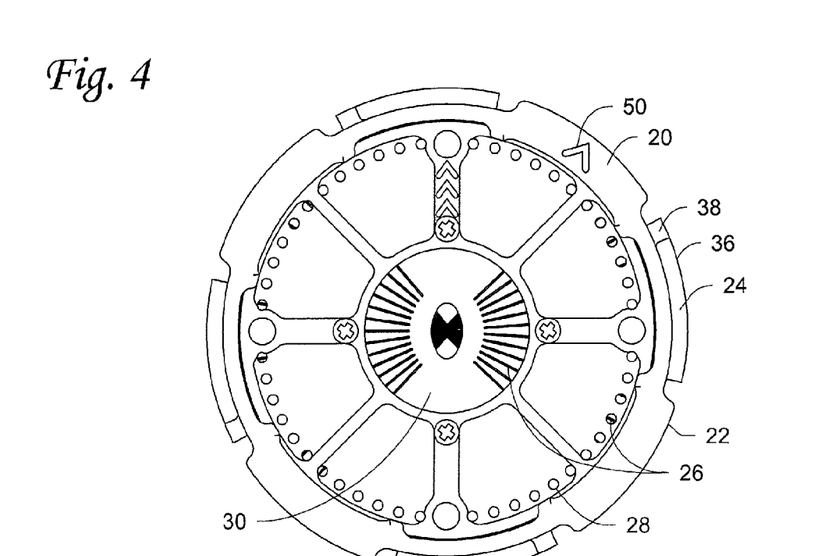
FIG. 4 is a top view of the probe test core of FIG. 1.
Figure 5:
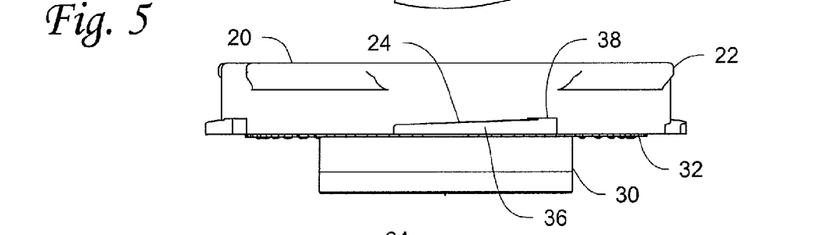
FIG. 5 is a side view of the probe test core of FIG. 1.

FIG. 3 shows a top view of the circuit board 14 alone, but further showing one embodiment of a layout for signal contacts 40 and guard contacts 42. In the example shown, the layout is a pattern of many signal contacts and a pattern of many guard contacts. As shown in FIG. 3, one embodiment for the configuration of the signal contacts 40 and guard contacts 42 is a spoke-like arrangement and configuration from the center of the plate, for example extending from the opening 18 toward the outer edge of the plate. The inner ends of the signal contacts 40 and guard contacts 42 allow contact with wires of the probe test core 12 so as to transmit from the test equipment assembly 10 to additional test and measurement equipment. For example, signals transmitted through probe wires of the probe test core from testing a semiconductor device, may be transmitted through the pattern of signal contacts 40 as well as the guard contacts 42. For example, a signal through the guard contact will match the voltage of the center conductor (e.g. signal contact) as much as possible to minimize leakage. It is also known to apply the voltage, for example, through a tester which continues to the probe needle, so that the guard signal traverses the interface between the probe test core 12 and the circuit board 14. In some embodiments for example, when probe wires are guarded, such as for example covered with a conductive polymer driven guard, such a guarded probe may continue from its contact at the circuit board through the end of the probe needle. It will be appreciated that the signal trace can function without the guard on nonsensitive signals.

With further reference to FIG. 3, the circuit board 14 includes one or more notches 44. In the example shown, the notch 44 is disposed at the inner annular rim, which defines the opening 18 of the circuit board 14. The notch 44 provides an alignment feature for when the probe test core 12 is connected to the circuit board 14. A corresponding protrusion or tab (see e.g. 34 in FIG. 7) on the probe test core 12 can be placed in the notch 44 during connection of the probe test core 12 to the circuit board 14. The protrusion or tab, which will be further discussed below, is configured as a mating alignment feature with the notch 44. Four notches are shown in FIG. 3, but it will be appreciated that more or less notches could be employed as needed and/or desired.

With further reference to the probe test core 12, the probe core 12 is insertable into the opening 18 of the circuit board. FIGS. 4-8 and FIG. 10 show various views of the probe test core shown in FIG. 1. The probe core 12 is configured to be connected and disconnected with the circuit board 14 (see e.g. FIG. 1). It will be appreciated that the probe test core 12 a variety of tools or insertion devices may be used as needed to mechanically connect the probe core 12 to the circuit board 14. For example, tools may be designed which grip the outer portion of the core 12 to allow the core 12 to be mounted in areas allowing minimal clearance.

In one embodiment, the probe core includes a frame 20, a wire guide 60 connected to the frame 20, a probe tile 30 connected to the wire guide 60, and a plurality of probe wires 26 supported by the wire guide 60 and probe tile 30. The frame 20 and wire guide 60 may be produced of different material, for example, the frame 20 and wire guide 60 may be constructed of different plastic composite materials to prevent galling. In the example shown, the frame 20 and the wire guide 60 in some embodiments rotate relative to each other, so that the probe wires supported by the wire guide can be first aligned onto the circuit board, and then the frame 20 can be rotated to lock and/or unlock the core relative to the circuit board (further described below).

The probe tile 30 also may be constructed of a different material than any of the frame 20 and wire guide 60. For example, the probe tile 30 is a dielectric material and may be composed of a ceramic material for example.

Figure 6:
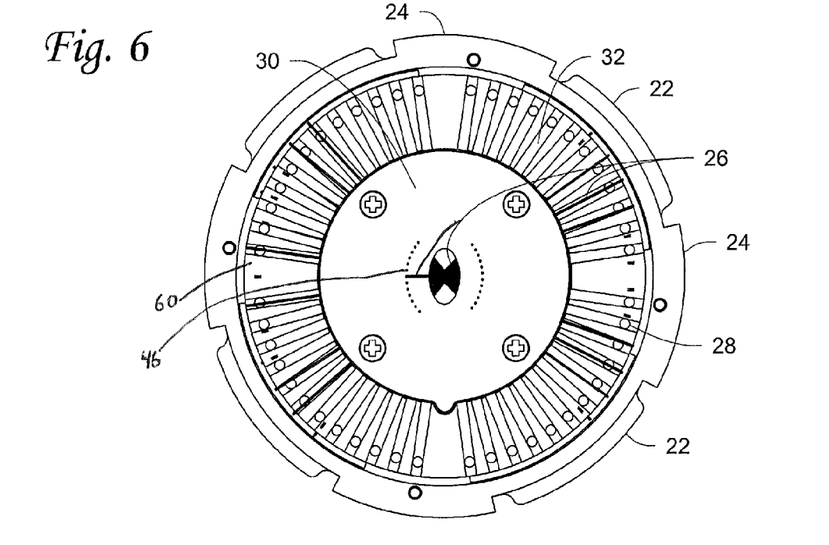
FIG. 6 is a bottom view of the probe test core of FIG. 1.
Figure 7:
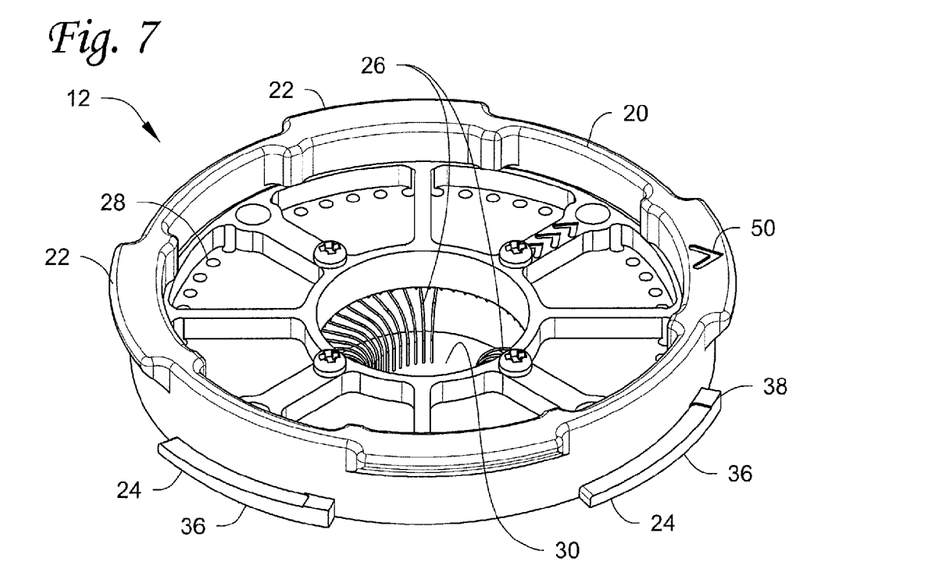
FIG. 7 is a top perspective view of the probe test core of FIG. 1 alone.
Figure 10:
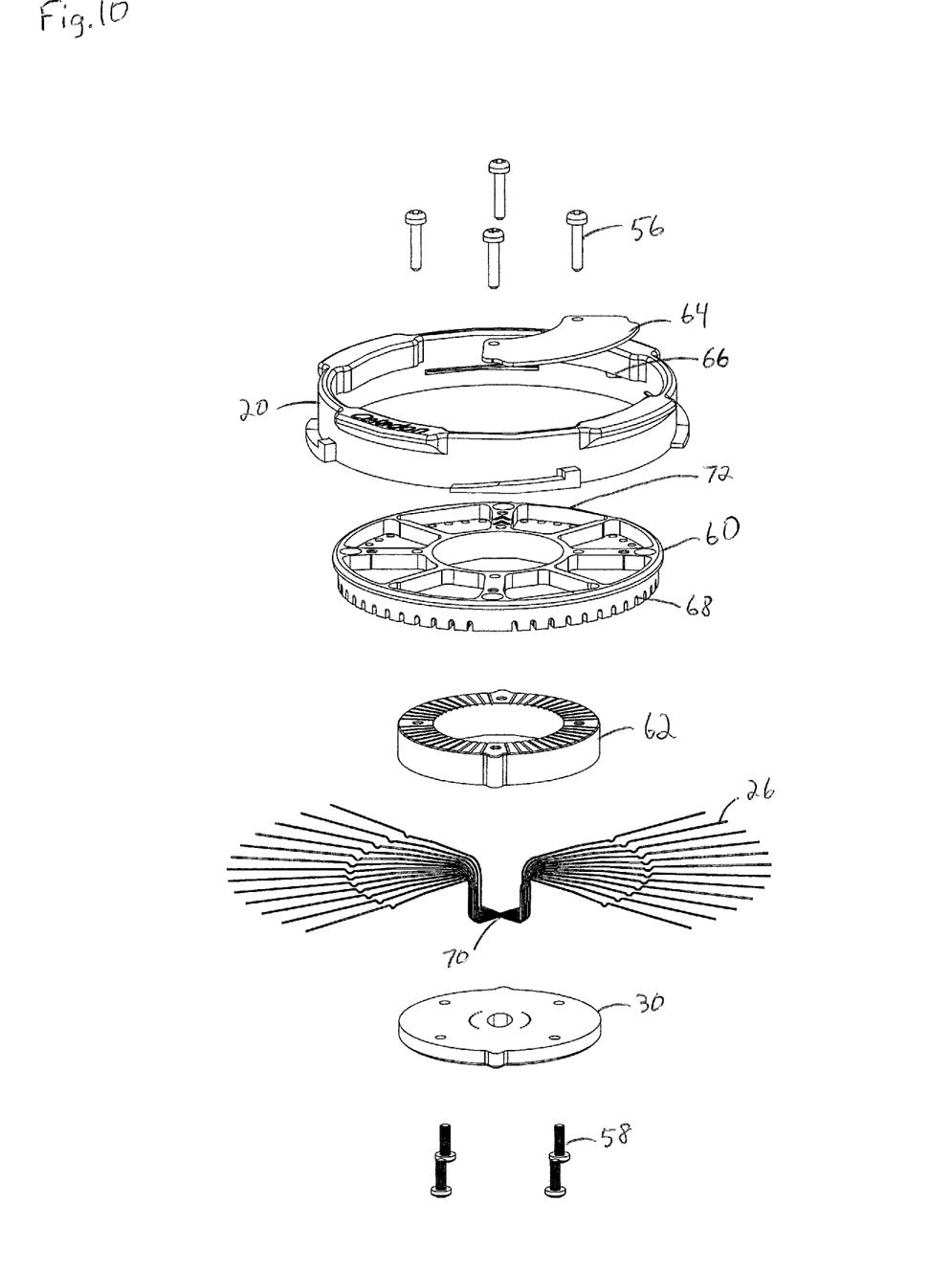
FIG. 10 is an exploded view of the probe test core of FIG. 1.

With reference to the probe wires 26, the probe wires 26 provide the probing function, for example by including probe needles and tips toward one end 70 (see FIG. 10). For example, the probe needles and tips 70 are disposed toward the center of the probe test core 12, see e.g. FIG. 6. With reference to FIG. 6, the wire guide 60 and probe tile 30 provide a channel 46 through the probe tile 30, that provide an inlet and outlet for each wire 26, and allows the wires to extend from the wire guide 60 into the probe tile 30, and out of the probe tile 30 to the exposed center of the probe test core 12. For ease of description, one probe wire 26 is shown as going through a channel 46 of the probe tile 30 (see e.g. FIG. 6). However, there are several channels 46 shown, and it will be appreciated that the other probe wires 26 also go through respective channels 46.

Figure 8:
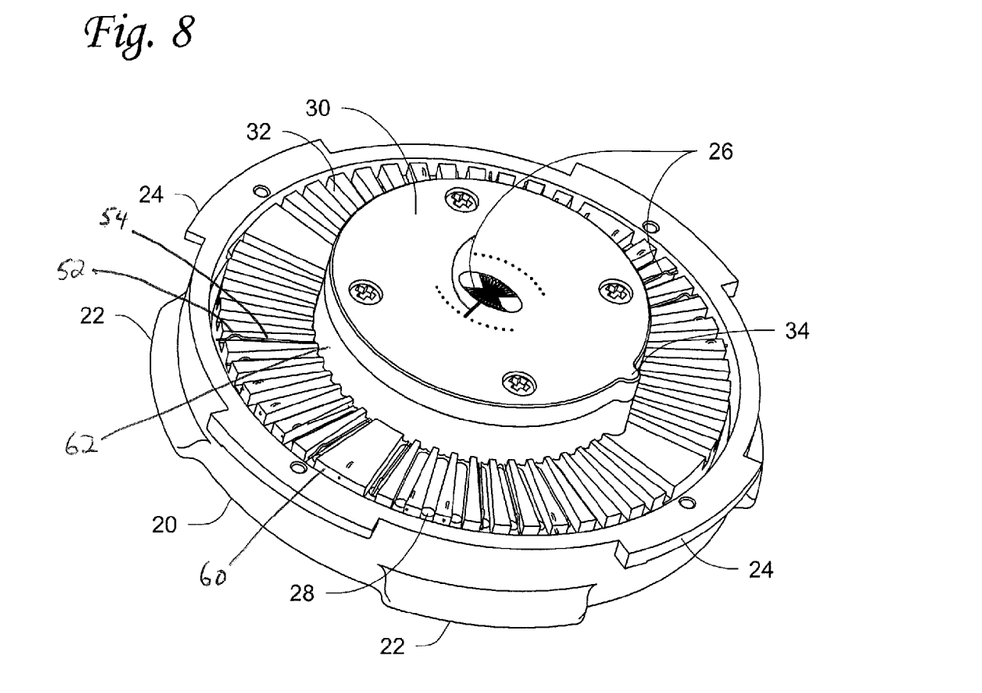
FIG. 8 is a bottom perspective view of the probe test core of FIG. 1 alone.

In operation, each probe wire 26 includes an end configured to probe a device, such as a semiconductor wafer. With reference to FIG. 8, for example, each wire 26 in one embodiment includes a signal transmitting portion 52 and a guard portion 54. In one embodiment, the signal transmitting portion 52 of each wire 26 is configured to contact a respective signal contact 40 in the pattern of signal contacts on the circuit board 14 close to the center of the circuit board 14 and opening 18. Likewise, the guard portion 54 of each wire 26 is configured to contact a respective guard contact 42 in the pattern of guard contacts close to the center of the circuit board 14 and opening 18. As mentioned above, in some embodiment, any one or more of the wires 26 may have a conductive polymer on the guard portion 54 supported by the groove 32 of the wire guide 30. It will be appreciated that the probe wires may be scaled to accommodate additional layers, such as for example, triax and quadrax type connectors.

With further reference to the probing wires 26, characteristics and construction of the probing wires may vary. Applicants' previous patents, which discuss probe characteristics and constructions, includes U.S. Pat. Nos. 6,975,128, 6,963,207, 6,992,495, 6,586,954, and 6,201,402, all of which are hereby incorporated by reference in their entirety, wherein one of skill in the art could use the subject matter described in these patents and apply it to probing wires, needles, tips, etc. of any probe test core described herein.

With further reference to the wire guide 60, in the embodiment shown, the wire guide 60 includes a groove structure to support each wire 26. Each groove 32 supports a portion of the wire 26 including the signal transmission portion 52 and the guard portion 54. In some embodiments, the grooves have a radiused surface 68 (see FIG. 10), which provide a convenient slot that aid in centering probe wires/needles, which can further facilitates alignment and eliminates mismatch between the replaceable probe core and motherboard. In some embodiments, the grooves 32 may be made using ball end mills.

In some embodiments, there is at least one hole 28 through a groove 32 and the wire guide 60. In the example shown, each groove 32 includes a hole 28 which extends through the wire guide 60. Generally, the hole 28 allows for any one or more of the wires 26 to be viewed, so that a respective wire 26 can be confirmed to be in a correct position.

For purposes of showing the groove structure and holes, not every groove 32 is shown to include a wire 26. However, it will be appreciated that each groove 32 may support a wire 26. It also will be appreciated that the number of holes 28 may vary, where a hole 28 may be provided for every groove or for less than every groove. Likewise, the layout and configuration of the groove structure may be modified as desired and/or appropriate. In the example shown, the groove structure is configured to match with a portion of the signal and guard contact pattern of the circuit board 14.

With reference to FIG. 10, the probe test core 12 is shown in an exploded view to show the probe test core elements in the embodiment of FIGS. 4-8. In some embodiments, the probe test core is an assembly of components making up the frame 20, wire guide 60, and probe tile 30. In one embodiment, the frame 20 is a ring structure that supports the lock features, further described below. The frame 20 supports the wire guide 60, which in some embodiments, may be composed of two main components. For example, in some embodiments the wire guide 60 functions as an upper wire guide 60 that is connected to an additional lower wire guide 62. The upper wire guide 60 and the lower wire guide 62 both cooperate to have the groove structure to support the probe wires 26 and feed them to the probe tile 30. For ease of illustration, the probe wires 26 are shown as extending beyond the circumference of the frame 20. It will be appreciated that the probe wires 26 do not extend beyond the frame 20 when the probe core 12 is assembled (see e.g. FIGS. 4-8). The wire guide (upper and lower 60, 62) are supported by the frame 20 and are connected to the probe tile 30, for example, by using a series of bolts and bolt-holes. For example, bolts 56 connect the upper and lower wire guides (60, 62) and bolts 58 connect the wire guide to the probe tile 30.

In some embodiments, a tag 64 may be included on the wire guide 60 as an area to identify the part. The tag 64 may also help function to protect certain core components below it.

With reference to the lock mechanism and its structures, the frame 20 in the embodiment shown supports the lock mechanism. As shown in the example of FIG. 10, the frame 20 is constructed as a lock ring that supports the structures of the lock mechanism and is rotatable with the probe tile 30 and wire guide 60. That is the frame 20 rotatable relative to the wire guide 60, which as shown is assembled with the wire guide 62, probe tile 30, and probe wires 26. Generally, the lock mechanism is configured to allow the probe core 12 to be connected and disconnected to another test equipment or component, such as the circuit board 14. In one embodiment, the probe core 12 is configured to connect and disconnect from the circuit board 14 in a rotatable lock and unlock operation.

In one embodiment, the lock mechanism includes at least one handle 22 and at least one ramped protrusion 24. The handle 22 is configured to allow a user to rotatably move the probe core 12 with respect to the circuit board 14. The ramped protrusion 24 extends outward from the frame and has a ramping portion 36 and a detent 38 configured to allow the probe core 12 to lock to the circuit board 14. In one embodiment, the lock mechanism allows for a twist or rotatable locking and unlocking operation to connect and disconnect the probe test core 12 from the circuit board 14. As shown, there are multiple handles 22 and ramped protrusions 24, but it will be appreciated that the number shown is merely exemplary and not intended to be limitative. In the example shown, the handles 22 and the ramped protrusions 24 are arranged in an alternating and somewhat overlapping configuration. When multiple handles 22 and ramped protrusions 24 are employed, such a configuration can allow for easier manufacture of the frame, such as mold processing.

As mentioned above, in some embodiments, further alignment features may be employed when connecting the probe test core 12 with the circuit board 14. For example, the alignment protrusion/tab 34 of the probe core 12 and the notch 44 of the circuit board 14 cooperate with each other to properly align the probe core 12 with the circuit board, i.e. align the probe wires of the probe core with the signal/guard contacts of the circuit board. As shown in FIGS. 6 and 8, for example, the protrusion or tab 34 can be used to cooperate with the notch 44 (see e.g. FIGS. 3 and 2) to facilitate alignment. As shown, the alignment tab 34 in some embodiments may be disposed on the probe tile 30, and may also extend as a portion of the lower wire guide 62.

In some alternatives, an additional twist or rotate state indicator 50 on the probe card 12 can be employed to further facilitate and confirm proper alignment and connection with the circuit board 14. For example, the indicator may be an arrow such as shown, which can point to a corresponding "lock" or "unlock" status indicator written on the guard plate 16 (not shown) of the circuit board 14.

With reference to connection and assembly, in one embodiment the probe core or card 12 is first aligned with the circuit board 14, for example by using the alignment protrusion 34 and notch 44. By the aligning step, each probe wire 26 has its signal transmitting portion 52 respectively aligned and in contact with a respective signal contact 40 of the pattern of signal contacts and each probe wire 26 has its guard portion 54 respectively aligned and in contact with a respective guard contact 42 of the pattern of guard contacts.

The probe card 12 can then be inserted and pressed down into the opening of the circuit board 14, and then can be rotated or twisted (e.g. the frame 20) with respect to the circuit board 14. The lock mechanism including the ramping portion 36 and detent 38 allow the probe card 12 to thereby lock onto the circuit board. For example, the ramped protrusion can be locked between the plate of the circuit board 14 and the guard plate 16.

As described above, the frame 20 and the wire guide 60, 62 and probe tile 30 in some embodiments rotate relative to each other, so that the probe wires 26 supported by the wire guide 60 can be first aligned onto the circuit board, and then the frame 20 can be rotated to lock and/or unlock the core relative to the circuit board. In such a configuration, the probe wires 26 can remain aligned with the pattern of contacts (40, 42) of the circuit board 14, while the probe core 12 is locked onto the circuit board 14.

With further reference to FIG. 10, in some embodiments the locking mechanism of the probe test core 12 includes a detent bump 66 on the frame 20 that cooperates with a detent slot 72 on the wire guide 60. This is further illustrated and explained below with respect to FIGS. 11 and 12.

Figure 9:
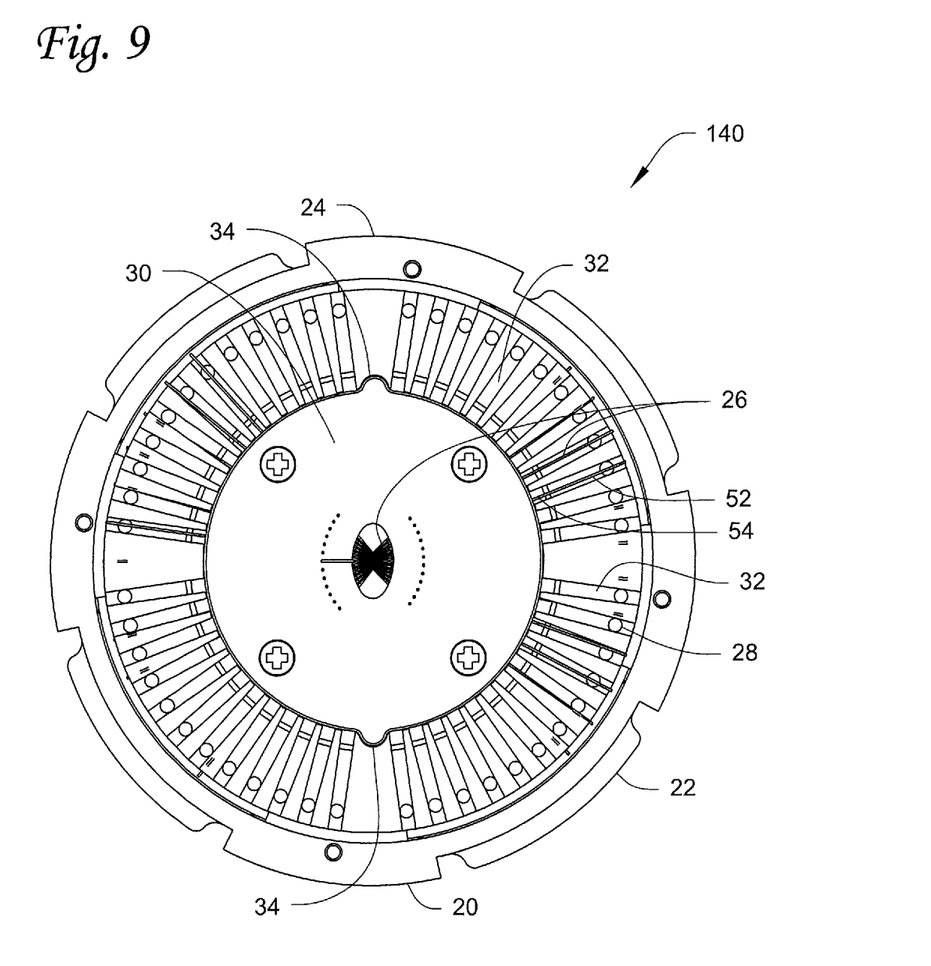
FIG. 9 is a bottom view of another embodiment of a probe test core.

With reference to FIG. 9, a bottom view of another embodiment of a probe test core 140 is shown. The probe test core is the same as the probe test core 12 shown in FIGS. 1 and 4-8, but showing additional alignment protrusions or tabs 34. In the non-limiting example shown, there are two tabs 34 that can mate with corresponding notches of a circuit board, e.g. circuit board 14.

Figure 11:
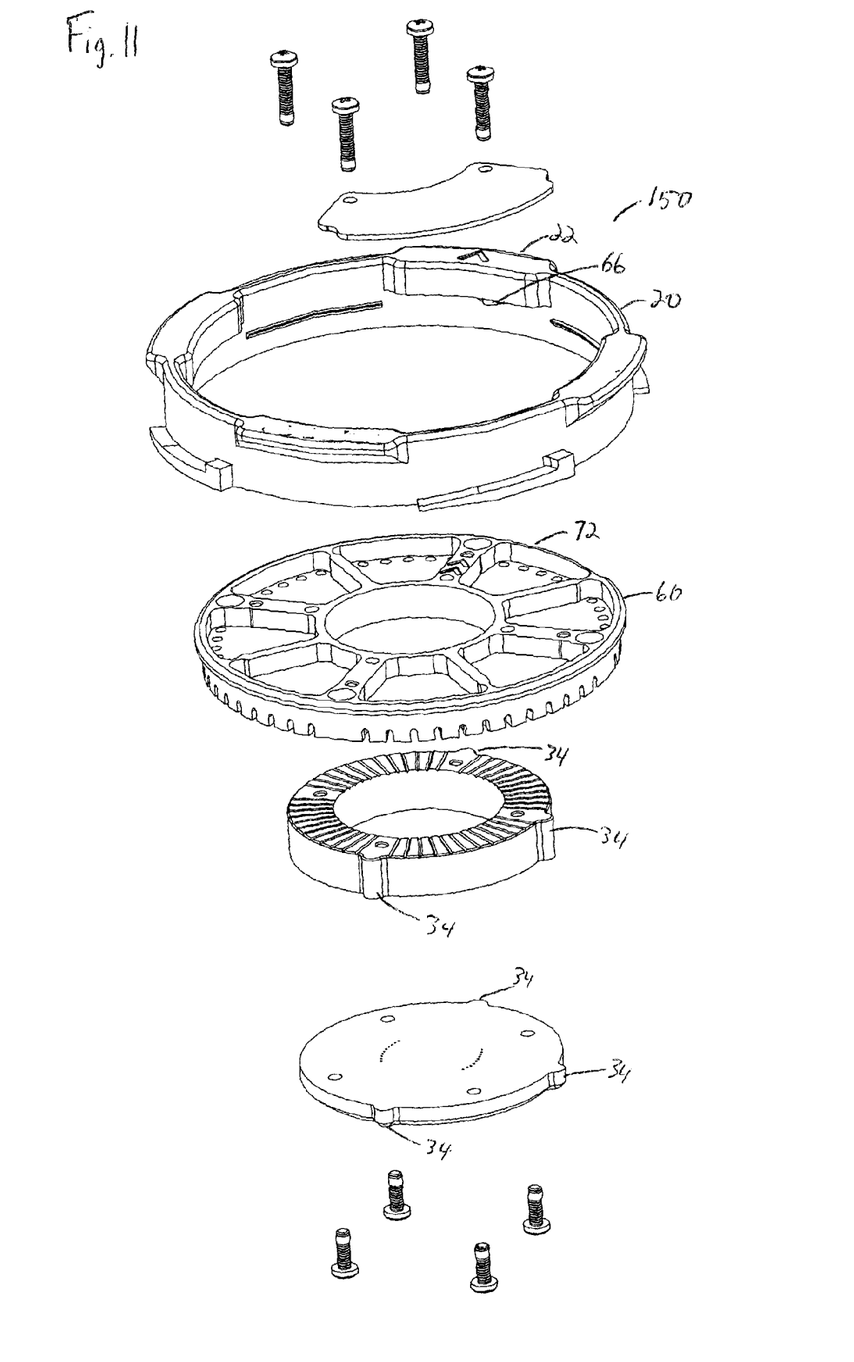
FIG. 11 is partial exploded view of the probe test core of FIG. 1.
Figure 12:
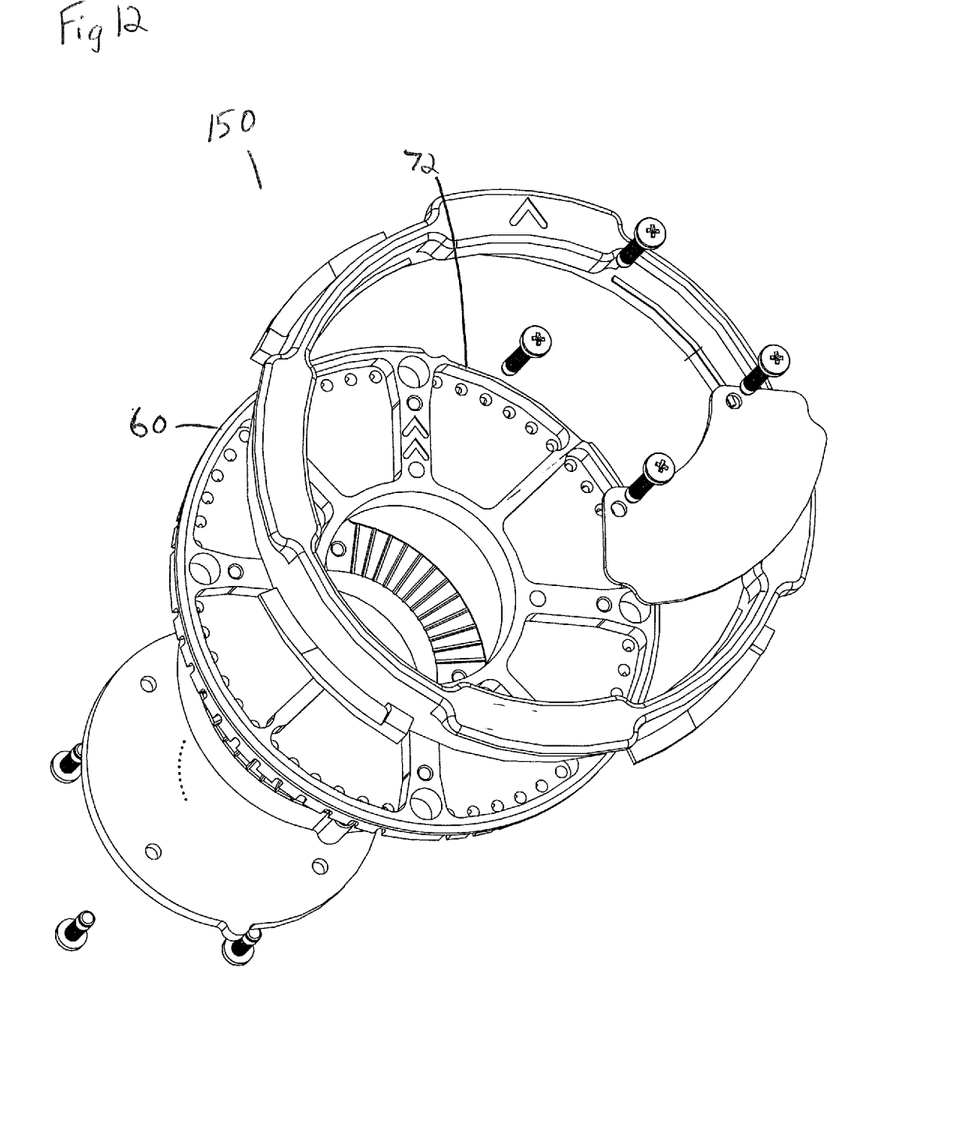
FIG. 12 is another partial exploded view of the probe test core of FIG. 1.

With reference to FIGS. 11 and 12, FIG. 11 is partial exploded view of the probe test core of FIG. 1. FIG. 12 is another partial exploded view of the probe test core of FIG. 1. The probe test core 150 is the same as the probe test core 12 shown in FIGS. 1, 4-8 and 10, but showing three alignment protrusions or tabs 34 on the wire guide 62 and probe tile 30 (see FIG. 11). Depending on the number of tabs 34 (and corresponding notches on the circuit board), which can be more or less than what is shown in FIG. 11, the manner in which the probe core is engaged with respect to the circuit board can be limited, for example to allow one orientation or four different options.

Also shown are the detent bump 66 (see FIG. 11) on the frame 20 and the detent slot 72 (FIG. 12) on the wire guide 60. In one embodiment, the detent bump 66 is disposed underneath a portion of one of the handles 22 so that it can engage the detent slot 72 of the wire guide 60. In one embodiment, the detent slot 72 is annularly disposed about an outer surface of the wire guide 60, for example along part of the outer circumference. As shown, the detent slot 72 is depressed relative to the remaining circumference of the wire guide 60. Such a configuration can provide tactile feedback on proper install during the rotational insertion operation of the probe core to the circuit board. When the frame 20 is rotated relative to the wire guide 60, the detent bump 66 is in contact with and slides along the detent slot 72, but is limited to movement of the frame 20 within the of the detent slot 72.

The disclosure herein can provide many structural advantages, among others, such as any one or more as follows.

1. The probe core and motherboard have a lock mechanism that allows for quick turn and clamping. For example, the ramped protrusions on the frame of the probe core help to apply force to make connection between the probe core and the motherboard, but allow the probe core to be replaceable. Generally, the locking mechanism allows for quick release and quick twist lock for swapping a probe core in and out of the motherboard.

2. The probe core provides a detent latch function. For example, the protrusion(s) 34 align with the motherboard, and it is desired for example to prevent the frame 20 from moving with respect to the protrusion(s) 34. To help prevent such movement, the core is configured to have a light detent against solid limit. For example, once the protrusion(s) 34 is engaged, the ramps 36 may be properly positioned, where the detent 38 can be easily overcome to achieve the twist lock.

3. Alignment indicators, such as the alignment tab and notch, allow for confirmation of proper orientation between the probe core and motherboard.

4. Alternating and some overlap of the locking ramps and handles allow for easier open and shut molding when manufacturing the frame of the probe core.

5. Use of dissimilar materials between sliding parts of the core, for example, between the frame and the wire guide, can prevent or at least minimize galling. For example, the frame 20 rotates or slides around the wire guide 60, where such components may be constructed of different materials. Also, the ramps 36 for example, may produce a clamping force transferred from the frame 20 to the wire guide 60 across the rotating interface. Since this rotational contact or "sliding" can be at a relatively high load, galling can be prevented or at least minimized by using different materials.

6. Radiused bottom of probe slots aids in centering probe needles to eliminate mismatch between the replaceable probe core and motherboard.

7. Holes in the frame allow final forming of contact needle as well as inspection of contact position after mating the probe core with the motherboard.

8. In some embodiments, the core may also include a plurality of pockets that allow for installation and identification and signal conditioning electrical components to be installed with a minimum of head room. For example, the wire guide 60 may have a series of depressed areas formed as truncated-pie-shape depressions just inside the array of holes 28 (see e.g. FIGS. 4 and 7). In some embodiments, these areas help keep the thickness even for molding and help provide a lower mounting profile and surface for other components that may be employed.

9. The distal end of the probe can be formed into a contact mechanism which eliminates extra parts. For example, where the probe wire 26 contacts the motherboard, there is no need for separate structures to make the contact, such as for example spring pins are not needed to make the contact. Thus, in some configurations for example, the probe wires are constructed to become the contact by special bending. For example, special bending entails forming the probe wire with a geometry, such that contact is made with the motherboard with the proper force and surface area to ensure low contact resistance between the signals and motherboard. For example, the contact force may be determined by the unsupported length of the probe wire. For example, the contact surface area may be determined by the radius on the contact. In some instances, it is desired to balance the contact force and contact surface area, so that the contact will not have high resistance, which can preserve the motherboard from wearing out prematurely.

Functionally, the test apparatus herein including for example the probe core and motherboard have observed various one or more of the following benefits, among others, which are outlined below.

1. The probe core is of relatively small size which can save space and costs, while providing ease of manufacture and rebuild.

2. The probe core is in keeping with Applicants' earlier probe concepts of contact and crash resistance and durability (e.g. using cantilever design of earlier patents incorporated by reference above).

3. Applicants have observed over 1 million touchdowns using the probes on the probe core on 37 µm aluminum pads.

4. The probes of the probe core can be constructed and configured so as to provide low noise and low leakage and low capacitance, and also operate within wide temperature ranges. Low leakage performance (e.g. fA/V) has been observed, for example, when 100V is applied to one needle/pin and all other pins are grounded at temperatures of 25° C. and 200° C. Results have shown that low leakage performance of the probes have been obtained, for example, at about 5 fA/V and about 1 fA/V at temperatures of about 25° C., and also at about 0.5 pA/V and about 2 fA/V at temperatures of about 200° C. Differences can depend upon the probe configuration, for example, the structure and configuration of the coating or guard on the probes.

5. The probes of the probe core can allow for high current and voltage testing, while maintaining fault tolerance.

6. The probes can have uniform beam length.

7. Durability of the probe core has been observed at higher than 10000 insertions which is over 20 times expected use conditions.

8. The motherboard is configured to perform over a wide range of temperatures, for example, between −65° C. to 220° C.

The numerous innovative teachings of the present application have been set forth above with particular reference to presently preferred but exemplary embodiments, wherein these innovative teachings are advantageously applied to the particular problems of a probe needle for measuring low currents with a wide operating temperature range in probing a semiconductor device. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

The following terms have been particularly described throughout the description and are not intended to be limitative:

Semiconductor Device Not Limitive

The present disclosure is particularly suitable for probing semiconductor devices, but the use of the present teachings is not limited to probing semiconductor devices. Other devices may be applied to the present invention teachings. Thus, while this specification speaks in terms of probing 'semiconductor' devices, this term should be interpreted broadly to include probing any suitable device.

Low Current Not Limitive

The present disclosure can solve the problem of measuring currents below 100 fA, but the current range of the present teachings is not limited to below 100 fA. For example, the present invention may be applied to measure the currents at or above 100 fA in a semiconductor device. Thus, while this specification speaks in terms of 'low currents' or 'measuring currents below 100 fA', these terms should be interpreted broadly to include any current that flows through a semiconductor device which could be at or above 100 fA. In a grounded guard controlled impedance configuration the present invention also solves the problem of measuring high frequency signals at high temperatures.

Wide Temperature Not Limitive

The present disclosure can solve the problem of measuring currents of a semiconductor device in a narrow or limited operating temperature range. The present teachings do not limit to a specific operating temperature range. The present application allows a tester to electrically probe semiconductor devices over a wide operating temperature range, not only at a low operating temperature but also a high operating temperature, e.g. an operating temperature up to 300° C. and beyond. Thus, while this specification speaks in terms of 'wide temperature range' or 'measuring currents in a wide operating temperature range', these terms should be interpreted broadly to include any suitable operating or testing temperature range of a semiconductor device.

Probe Not Limitive

The present disclosure can solve the problem of measuring currents of a semiconductor device using a shielded probe, for example a co-axial shielded probe. However, nothing in the teachings of the present invention limits application of the teachings of the present invention to a probe needle with more or less layers if appropriate and/or desired. Advantageous use of the teachings herein may be had with a probe needle of any number of layers.

Signal Contact/Cable and Guard Contact/Cable Not Limitive

The present disclosure can solve the problem of measuring currents of a semiconductor device using a co-axial or a tri-axial signal cable. However, nothing in the teachings of herein limits application of the teachings of the present disclosure to a signal cable with more or less layers. Advantageous use of the teachings herein may be had with a signal cable of any number of layers.

Metals Not Limitive

Throughout the discussion herein have been references to metals in regards to needle and driven guard. The present disclosure does not recognize any limitations in regards to what types of metals may be used in affecting the teachings herein. One skilled in the art will recognize that any conductive material may be used with no loss of generality in implementing the teachings of the present disclosure.

Dielectric not Limitive

Throughout the descriptions herein reference has been made to the term dielectric. The present disclosure does not recognize any limitations in regards to what types of dielectric may be used in affecting the teachings herein. One skilled in the art will recognize that any non-conductive, highly heat-resistant material may be used with no loss of generality in implementing the teachings of the present disclosure.

The embodiments disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A probe apparatus for testing a semiconductor device comprising:
   a board having a pattern of signal contacts and a pattern of guard contacts, the board configured as a plate having a top side, a bottom side, and an opening through the top and bottom sides, wherein the pattern of signal contacts and the pattern of guard contacts are disposed on the top side of the board; and
   a probe core insertable into the opening from the top side toward the bottom side and configured to be connected and disconnected with the board, a probe tile and a wire guide that supports a plurality of probe wires on a bottom side of the probe core, the plurality of probe wires having an end configured to probe a semiconductor device, the plurality of probe wires having a signal transmitting portion matching a portion of a signal contact in the pattern of signal contacts, and the plurality of probe wires having a guard portion matching a portion of a guard contact in the pattern of guard contacts;
   a frame connected to and supporting the wire guide, the frame being rotatable relative to the wire guide and the probe tile; and
   a lock mechanism supported on the frame,
   wherein the probe core is lockable via rotation of the frame relative to the wire guide onto the board such that the signal transmitting portion and the guard portion of the plurality of probe wires remain aligned and engage the pattern of signal contacts and the pattern of guard contacts from the bottom side of the probe core onto the top side of the board.

2. The probe apparatus of claim 1, wherein the lock mechanism comprises a ramped protrusion and a handle, the ramped protrusion having a detent configured to allow the probe core to lock onto the board, and the handle being configured to allow a user to rotate the probe core to lock and unlock the probe core from the board.

3. The probe apparatus of claim 1, wherein the wire guide comprises a groove structure to support the plurality of probe wires, the groove structure supports a portion of the signal transmission portion and the guard portion.

4. The probe apparatus of claim 3, wherein the groove structure includes a plurality of grooves having a radiused surface, the radiused surface providing an alignment feature for the plurality of probe wires when assembled with the wire guide.

5. The probe apparatus of claim 1, wherein the wire guide comprises at least one hole viewable of one of the wires of the plurality of wires, the hole configured to allow confirmation position of the respective wire.

6. The probe apparatus of claim 1, further comprising a detent bump on the frame that cooperates with a detent slot on the wire guide, the detent bump is in contact with and slides along the detent slot and is limited to movement of the frame within the radius of the detent slot when the frame is rotated relative to the wire guide.

7. The probe apparatus of claim 1, wherein the frame and wire guide are constructed of different materials.

8. The probe apparatus of claim 1, wherein the board comprises a notch, and the probe core comprises a protrusion, the protrusion configured to be placed in the notch to align the probe core onto the board.

9. The probe apparatus of claim 1, wherein the board comprises a guard plate disposed thereon.

10. The probe apparatus of claim 1, wherein the wire guide comprises a tag thereon to identify the apparatus and to protect the probe core.

11. The probe apparatus of claim 1, wherein the probe core comprises a state indicator to confirm alignment of the probe core with the board.

12. A probe core comprising:
    a frame;
    a wire guide supported by the frame, the wire guide comprising a groove structure;
    a probe tile connected to the wire guide;
    a plurality of probe wires supported by the wire guide and probe tile on a bottom side of the probe core, the probe wires including an end configured to probe a semiconductor device and having a signal transmitting portion and a guard portion, wherein a portion of the signal transmitting portion extends from the groove structure and relative to the guard portion; and
    a lock mechanism supported by the frame,
    wherein the frame is rotatable relative to the wire guide and the probe tile and the lock mechanism is configured to allow the probe core to be connected and disconnected to a board via a rotation of the frame relative to the wire guide;
    and wherein the probe core remains aligned to the board during the rotation of the frame relative to the wire guide.

13. A method for assembling a probe card onto a board comprising:
    aligning a probe card with a board, the probe card having a plurality of probe wires on a bottom side of the probe card, the probe wires having a signal transmitting portion and a guard portion, and the board having a top side with a pattern of signal contacts and a pattern of guard contacts;
    inserting the probe card into the board from the top side of the board such that the signal transmitting portion and the guard portion of the probe wires are engageable with the pattern of signal contacts and the pattern of guard contacts; and
    locking the probe card onto the board by rotating a frame of the probe card with respect to the board,
    wherein by the aligning step, the signal transmitting portion of the probe wires is aligned and in contact with a portion of a signal contact of the pattern of signal contacts and the guard portion of the probe wires is aligned and in contact with a portion of a guard contact of the pattern of guard contacts, and
    wherein the signal transmitting portion of the probe wires remains aligned and in contact with the portion of the signal contact of the pattern of signal contacts and the guard portion of the probe wires remains aligned and in contact with the portion of the guard contact of the pattern of guard contacts when rotating the probe card with respect to the board.

14. The probe apparatus of claim 3, wherein a portion of the signal transmitting portion matching the portion of the signal contact in the pattern of signal contacts extends from the groove structure and relative to the guard portion.

15. The probe core of claim 12, wherein the probe core is connected and disconnected to the board in a twist lock and unlock operation through rotation of the frame relative to the wire guide and probe tile.

* * * * *